United States Patent
Taihaku et al.

[11] Patent Number: 5,847,491
[45] Date of Patent: Dec. 8, 1998

[54] PIEZOELECTRIC TRANSFORMER

[75] Inventors: Naoto Taihaku; Takayuki Inoi, both of Tokyo, Japan

[73] Assignee: NEC Corporation, Tokyo, Japan

[21] Appl. No.: 878,965

[22] Filed: Jun. 19, 1997

[30] Foreign Application Priority Data

Jun. 19, 1996 [JP] Japan .................................. 8-157753

[51] Int. Cl.⁶ .................................................. H01L 41/08
[52] U.S. Cl. ........................ 310/355; 310/348; 310/366; 310/352
[58] Field of Search .................... 310/344, 348, 310/352, 354, 355, 366

[56] References Cited

U.S. PATENT DOCUMENTS

| | | | |
|---|---|---|---|
| 2,771,561 | 11/1956 | Fuller | 310/348 X |
| 3,612,922 | 10/1971 | Furnival | 310/351 |
| 3,694,674 | 9/1972 | Inoue | 310/344 X |
| 4,608,509 | 8/1986 | Yamamoto et al. | 310/354 X |
| 4,695,756 | 9/1987 | Tanaka | 310/355 |
| 5,250,870 | 10/1993 | Fenlon et al. | 310/352 X |
| 5,598,133 | 1/1997 | Fuse | 310/348 X |

FOREIGN PATENT DOCUMENTS 1-167718  11/1989  Japan .

*Primary Examiner*—Mark O. Budd
*Attorney, Agent, or Firm*—Young & Thompson

[57] ABSTRACT

A piezoelectric transformer element 1 is supported by a plurality of contact pins 5b provided on a printed wiring board 6. The contact pins are directly contacted to lower electrodes of the piezoelectric transformer element at its nodal points. An insulating case 4 accommodating the piezoelectric transformer element 1 is provided with a plurality of leads 3 which contact upper electrodes of the piezoelectric transformer element 1 at its nodal points. The insulating case 4 and the printed wiring board are combined together to provide electrical connection between the leads and wirings of the printed wiring board.

14 Claims, 12 Drawing Sheets

PIEZOELECTRIC TRANSFORMER

BACKGROUND OF THE INVENTION

1. Field of the Invention

The present invention relates to a piezoelectric transformer for an inverter circuit used in such as a cold cathode fluorescent tube for back lighting of a liquid crystal display panel, and more particularly to its package construction for mounting a piezoelectric transformer element on a printed wiring board.

2. Description of the Prior Art

A Japanese Unexamined Utility Model publication (Kokai) No. 1-167718 shows in its FIG. 18 a construction and a technique for mounting a piezoelectric element 1801 on a printed wiring board (PWB) 1804 using a conductive case 1803 of a concave shape. An electric contact is secured by electrically connecting elastic and arc-shaped terminal plates 1802 respectively to the upper and lower electrodes of the piezoelectric element 1801 and connecting the upper electrode to a conductive portion 1805a provided on the PWB 1804 through the upper terminal plate 1802a and the conductive case 1803. The lower electrode of the piezoelectric element 1801 is connected with a conductive portion 1805b on the PWB 1804 through the lower terminal plate 1802b. By interposing each of the upper and lower terminal plates 1802a and 1802b, respectively, between the conductive case 1803 and the piezoelectric element 1801, and between the piezoelectric element 1801 and the electrode 1805b on the PWB, the upper and lower terminal plates 1802a and 1802b are positioned but they are not fixed.

The above-mentioned prior art uses a conductive case for accommodating a piezoelectric element and in case of mounting a piezoelectric transformer element on a PWB according to this composition, a parasitic capacitance or a wiring capacitance produced around the piezoelectric transformer element becomes fairly great and a leakage current caused by this becomes large and so a high input/output conversion efficiency cannot be achieved. And since a conductive case is used, there is a possibility that a dielectric breakdown happens between driving terminals for applying a voltage to the piezoelectric element and particularly in case of mounting a piezoelectric transformer element according to this composition, since the piezoelectric transformer element has a high voltage generated between its input and output sides, a dielectric breakdown is more liable to happen.

Furthermore, since a terminal plate used for leading out an electrode of a piezoelectric element is in a size as large as the surface area of the piezoelectric element, in case of mounting the piezoelectric transformer element on a PWB according to this composition, a parasitic capacitance is liable to be produced in the same way as the above-mentioned problem and its input/output conversion efficiency is deteriorated.

Moreover, since a terminal plate used for leading out an electrode of a piezoelectric element is not fixed, the terminal plate may be moved by vibration of the piezoelectric element, and particularly since a piezoelectric transformer element has a very high vibration level much higher than a small vibration of a piezoelectric element, an amount of movement of the terminal plate becomes so large that it cannot be stably held. As a result, there is a problem that the piezoelectric transformer element cannot be held stably at its nodal point and electrical characteristics of the piezoelectric transformer element are deteriorated. And there is a possibility that since the terminal plate is not fixed, the terminal plate touches the conductive case, and the input and output sides of the piezoelectric transformer element are short-circuited with each other and the piezoelectric transformer element is broken.

SUMMARY OF THE INVENTION

An object of the invention is to provide a piezoelectric transformer capable of attaining a high input/output conversion efficiency by minimizing a parasitic capacitance produced around its piezoelectric transformer element.

Another object of the invention is to provide a piezoelectric transformer having a reliable resistance to vibration and shock.

A still another object of the invention is to provide a piezoelectric transformer having a high reliability in electrical connection.

A further object of the invention is to provide a piezoelectric transformer having a high input/output conversion efficiency without deteriorating characteristics of its piezoelectric transformer element by not performing reflow process in mounting the piezoelectric transformer.

A still further object of the invention is to provide a piezoelectric transformer low in cost through improving the piezoelectric transformer in productivity by making its piezoelectric transformer element possible to be easily mounted on a printed wiring board.

A piezoelectric transformer of the present invention is characterized by that it is a piezoelectric transformer made by mounting, on a PWB through an insulating case, a piezoelectric transformer element comprising a piezoelectric member in a rectangular parallelepiped shape having electrodes formed respectively on its upper and lower surfaces, in which electrical connections between a wiring circuit on the PWB and the upper and lower electrodes of the piezoelectric transformer element are performed respectively through lead terminals provided on the insulating case and contact pins provided on the PWB, and in which the electrical connections are performed at the same time as mounting said insulating case on the PWB and wiring patterns on the PWB to be connected respectively to the electrodes on the upper and lower surfaces of said piezoelectric transformer element are 10 mm or more distant in superfacial distance from each other.

The insulating case has a concave shape and being provided with snap fitting portions. The lead terminals are provided in the insulating case in the shape of a cantilever whose at least one portion is insert-molded into a side wall of the insulating case and its contact portion has a shape of a linear contact area. The contact pins provided on the printed wiring board has cylindrical shape and its contact portion has a flat face contact area. The piezoelectric transformer element is sandwiched at its nodal points between the lead terminals and the contact pins fixed on the printed wiring board. Each of the supporting force at each supporting point is selected to be 60 gf or less.

Furthermore, it is characterized by that the linear contact area is 0.5 mm or less in length and the contact pin contact area is 0.9 mm or less in diameter so as not to deteriorate a conversion efficiency.

In a piezoelectric transformer, when a parasitic capacitance or a wiring capacitance is produced around the piezoelectric transformer element at the time of operation, a leakage current flows corresponding to this capacitance and loss of the output power is caused by loss of the output current and the power conversion efficiency of the piezoelectric transformer is lowered. Thereupon, by using an insulating material for a case accommodating a piezoelectric transformer element and making a conductive member of elasticity for supporting the piezoelectric transformer small enough in comparison with the plan-projected area of the piezoelectric transformer element, it is possible to make small to the utmost the parasitic capacitance produced around the piezoelectric transformer element.

The input and output wiring patterns on the printed wiring board which are connected respectively with the input and output terminals of the piezoelectric transformer element are made so that the wiring patterns are not short-circuited with each other due to occurrence of a high voltage by extending the superfacial distance between the patterns through making slits in the printed wiring board.

With regard to leads and contact pins for pressing the piezoelectric transformer element, the former are insert-molded into the side wall of the case and the latter are fixed on the printed wiring board. Therefore, since both of them are not moved inside the case when vibration or shock is applied to the case, the input and output sides of the piezoelectric transformer are not short-circuited with each other and the piezoelectric transformer does not get out of order and is not broken due to an external stress such as vibration or shock.

In supporting a piezoelectric transformer element by means of the leads and the contact pins, it is necessary to make a pressing force and an area for pressing the piezoelectric transformer element as small as possible in order that the piezoelectric transformer can attain a high power conversion efficiency. However, since a piezoelectric transformer is used in an inverter circuit for back lighting of a liquid crystal display of a notebook personal computer or the like, when vibration or shock is applied to the notebook-type personal computer in use, a short break happens when the back lighting is on and an image on the liquid crystal display screen is jerked, and so a pressing force for supporting the piezoelectric transformer element needs to be so adequate as not to disturb vibration of the piezoelectric transformer element and not to cause a short break.

Connection between the insulating case accommodating a piezoelectric transformer element and the printed wiring board can be performed with a one-touch operation of fitting snap fitting portions attached to said insulating case into slits provided in the printed wiring board. Any of the lead terminals and the contact pins need no soldering but they can be electrically connected to the printing wiring board at the same time as mounting of the insulating case.

In case that soldering is needed, there is a processing method such as a reflow soldering process in consideration of mass-productivity, but since a piezoelectric transformer element is polarized by applying a high voltage to it in a high-temperature environment and comes to have characteristics as a piezoelectric transformer, when it is again exposed to a high-temperature environment, its polarization is deteriorated and its electromechanical coupling factor which is one of electrical characteristics of a piezoelectric transformer is lowered and so there is a problem of bringing deterioration of its power conversion efficiency. However, since the present invention needs no reflow process, it can provide a piezoelectric transformer which causes no deterioration of characteristics of its piezoelectric transformer element, reduces production time, and is suitable for mass production and is inexpensive.

DESCRIPTION OF THE PREFERRED EMBODIMENTS

Figure 1:
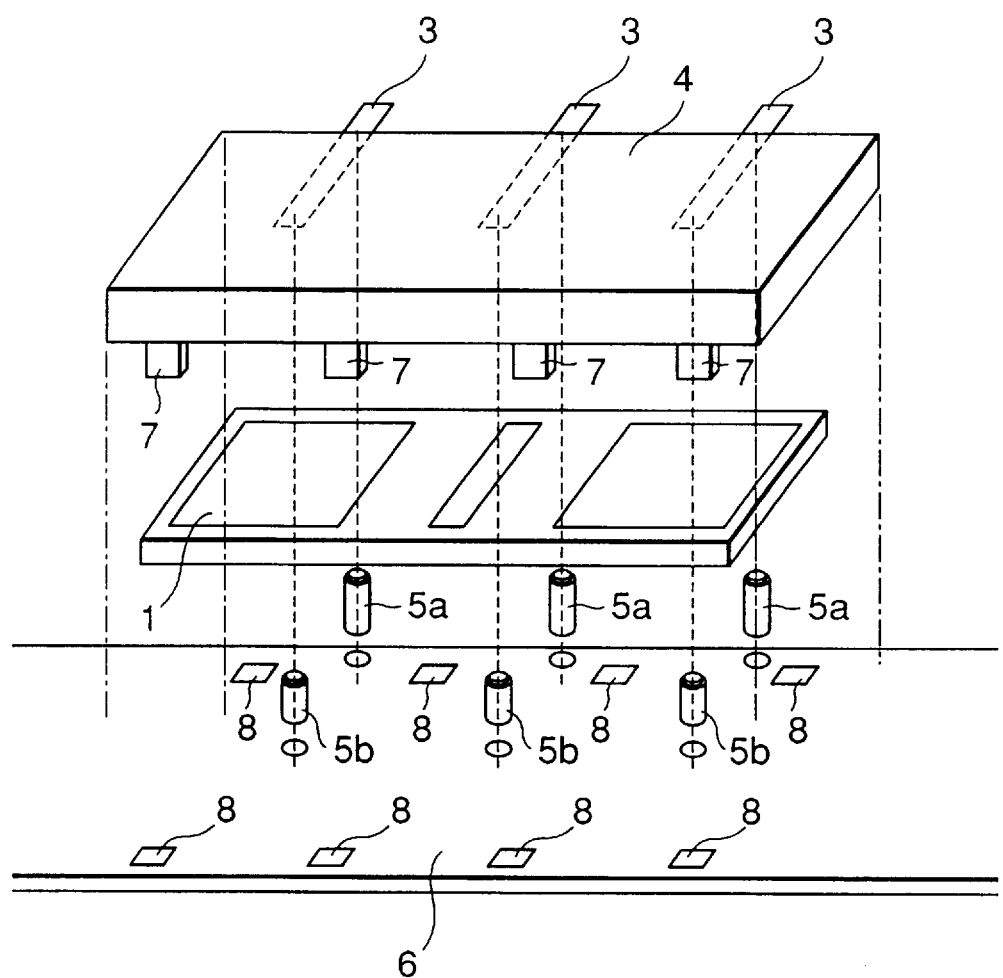
FIG. 1 is a perspective view showing construction of a first embodiment of the invention.

Referring to FIG. 1, a piezoelectric transformer element 1 is accommodated in an insulating case 4 of a concave shape having a lead 3 provided at its side wall. Four pairs of snap fitting portions 7 are molded in one body respectively along the longitudinal sides at the bottom of the insulating case 4 and four pairs of openings 8 are provided at positions on a PWB 6 corresponding to said snap fitting portions 7. By combining these with each other a mounting operation can be easily performed with a one-touch operation.

Figure 2:
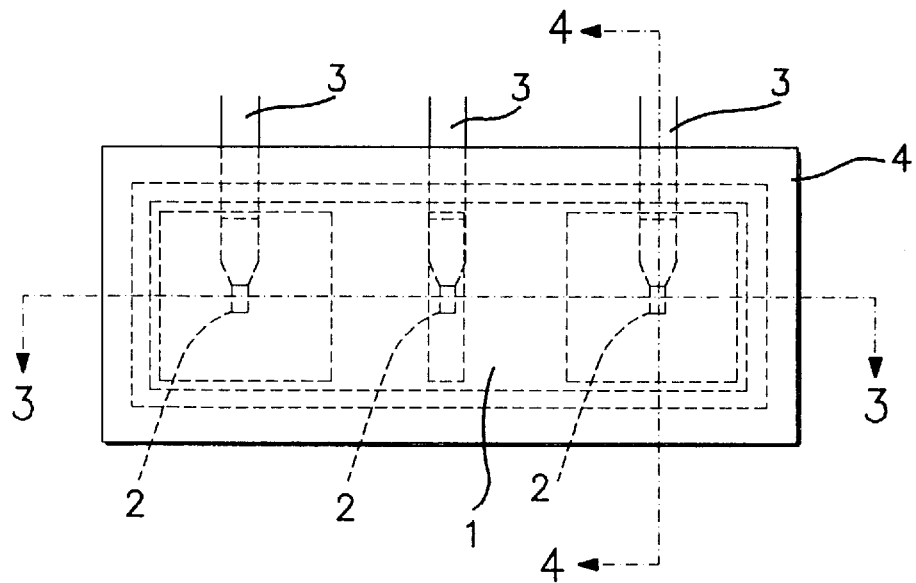
FIG. 2 is a plan view showing construction of the first embodiment of the invention.
Figure 3:
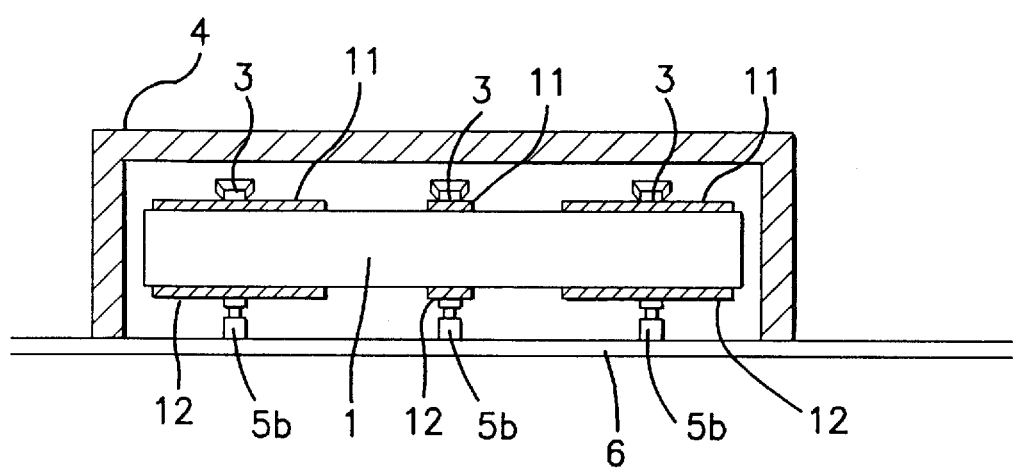
FIG. 3 is a sectional view taken along a line A—A of FIG. 2.
Figure 4:
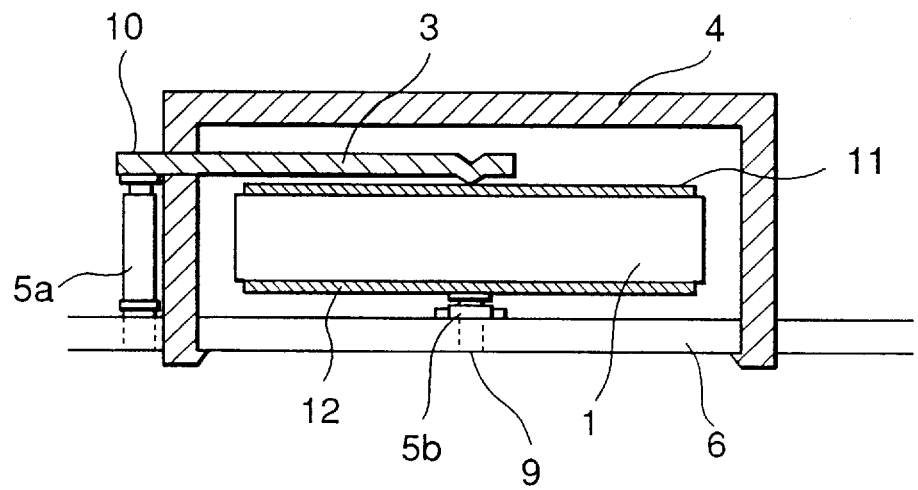
FIG. 4 is a sectional view taken along a line B—B of FIG. 2.

As shown in FIG. 2, a piezoelectric transformer element 1 of the third order Rosen type has three nodal points 2 at three positions on the upper and lower faces of the piezoelectric transformer element 1, and is held inside an insulating case 4 by being pressed by a lead 3 from the upper face and by a contact pin 5b from the lower face at a position corresponding to each nodal point 2. For electrically connecting electrodes 11 and 12 provided on the upper and lower faces of the piezoelectric transformer element 1 to a PWB 6, as shown in FIG. 4, a projection of the lead 3 is brought into contact with the upper electrode 11 of the piezoelectric transformer element 1 by means of a spring force of the lead itself. Here, the lead 3 is led out through a side wall of the insulating case 4 to protrude outside the insulating case 4, and the upper electrode 11 of the piezoelectric transformer element 1 and the PWB 6 can be electrically connected with each other by interposing a contact pin 5a electrically connected to a wiring pattern (not illustrated) of the PWB between the outside lead portion 10 of the lead 3 and the PWB 6. For electrically connecting the lower electrode 12 of the piezoelectric transformer element 1 and the PWB 6 with each other, the lower electrode 12 of the piezoelectric transformer element 1 and the PWB 6 can be electrically connected with each other by interposing a contact pin 5b shorter than the contact pin 5a between the lower electrode 12 of the piezoelectric transformer element 1 and the PWB 6. It is a matter of course that the contact pin 5b is electrically connected to an unillustrated wiring pattern on the PWB.

Figure 5A:
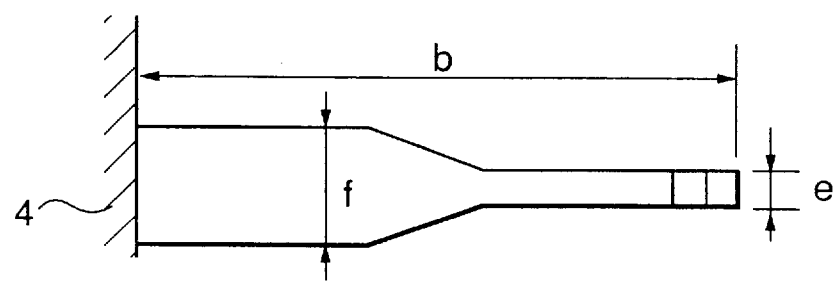
FIG. 5A is a plan view showing the shape of a lead terminal insert-molded into an insulating case of the invention.
Figure 5B:
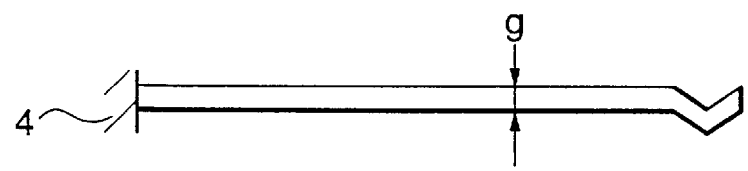
FIG. 5B is a side view of FIG. 5A.

Next, a construction for supporting the piezoelectric transformer element 1 is described in the following. FIGS. 5A and 5B are respectively a plan view and a side view showing the shape of the lead 3 for performing an electrical connection of the upper electrode 11 of the piezoelectric transformer element 1. A state of the lead 3 shown in FIG. 5 shows its shape when no load is applied to the lead 3, and when a load is applied to it, it presses the piezoelectric transformer element 1 at its nodal point 2 to support it by the principle of a cantilever. As shown in FIG. 5, the lead 3 has a line-shaped contact portion to be brought into contact with the upper electrode of the piezoelectric transformer element 1. On the other hand, a contact pin 5b having a spring function is used for supporting the piezoelectric transformer element 1 from the lower side.

Figure 6A:
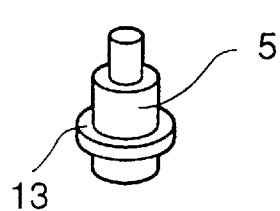
FIG. 6A is a perspective view of a contact pin.
Figure 6B:
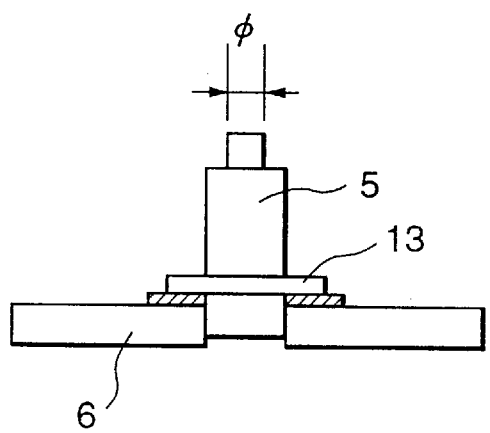
FIG. 6B is a sectional view showing a state in which the contact pin is fixed to the PWB.

FIGS. 6A and 6B are respectively a plan view and a perspective view of the contact pin 5b used in this embodiment. The contact member of the contact pin 5b to be brought into contact with the piezoelectric transformer element 1 is cylindrical in shape and has a flat contact face. The piezoelectric transformer element 1 can be stably held by using a flat contact area at least at one side out of the upper and lower sides from which the piezoelectric transformer element 1 is supported.

Figure 7:
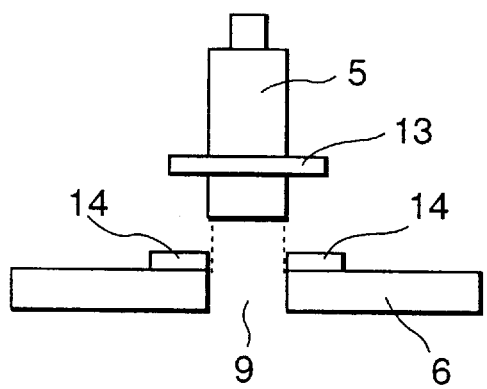
FIG. 7 is a sectional view showing a process of fixing a contact pin to the PWB.

Next, electrical connection of contact pins 5 of two kinds to the PWB 6 is described in the following. FIG. 7 is a sectional view showing a state in which the contact pin 5 used in this embodiment has been mounted in the PWB 6. As shown in FIG. 7, the contact pin 5 is provided with a stopper 13 for preventing its slipping out, and this stopper 13 prevents the contact pin 5 from slipping out downward from the PWB 6. In order to locate the contact pin 5, the PWB 6 has six contact pin fixing holes 9, and has a land pattern 14 wired around each of the holes 9. An electrical connection between the PWB 6 and the contact pin 5 is secured by inserting the contact pin 5 into the hole 9 and bringing the stopper 13 into contact with the land region 14 on the PWB 6. Since this electrical connection can be performed at the same time as mounting the insulating case 4 on the PWB 6, it is possible to reduce a time-consuming process.

Figure 8:
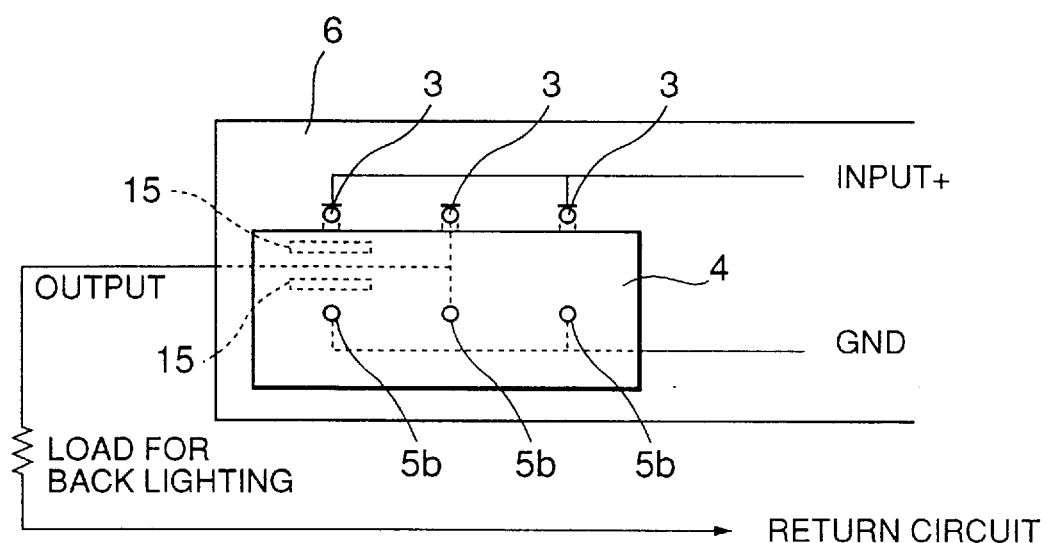
FIG. 8 is a schematic diagram showing a wiring on the PWB and input and output wirings of a piezoelectric transformer of the first embodiment of the invention.

FIG. 8 is a plan view showing a pattern wiring of a circuit on the PWB in this embodiment. The two lead 3 at both sides of the three upper lead 3 are input electrodes and are connected with each other, and the two contact pins 5b at both sides of the three lower contact pins 5b are also input electrodes and are connected with each other. The upper and lower central terminals are output electrodes and are also connected with each other. In order to prevent the input and the output side from being short-circuited with each other, the PWB 6 has short-circuit preventing slits 15 provided in the areas of the wiring pattern where the input line and the output line are closest to each other.

First Embodiment

A typical example of a piezoelectric transformer of this embodiment is described in the following. The transformer element 1 has the shape and dimensions where width W=10 mm, thickness t=1 mm, and length L=42 mm. In all of the embodiments in the following, a piezoelectric transformer element 1 has the above-mentioned shape.

Figure 9A:
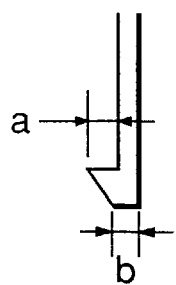
FIG. 9A is a side view showing the shape of a snap fitting portion provided on an insulating case for accommodating a piezoelectric transformer element of the invention.
Figure 9B:
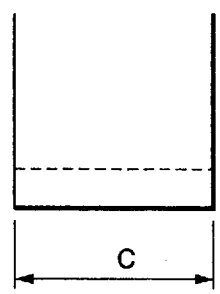
FIG. 9B is a plan view of FIG. 9A.

Zenite 7130 (trade name, manufactured by Du Pont Inc.) which is a liquid crystal polymer was used as a molding material for the insulating case 4. This embodiment is different from the prior art in a point of using an insulating material for the case. It is the greatest object of this embodiment to minimize a parasitic capacitance produced around the piezoelectric transformer element 1 by using the insulating case 4. Corresponding to the shape and dimensions of said piezoelectric transformer element 1, the insulating case 4 has the shape and dimensions where the maximum width= 16 mm, height=4.2 mm when it has been mounted on the PWB, and length L=45 mm. And in a snap fitting portion 7 having a hook, as shown in FIG. 9, it was set that height of the hook a=0.1 mm, thickness b=0.5 mm, and width c=3 mm. The construction of the snap fitting portion 7 could achieve a shock resistivity of 1000 G or more in a direction perpendicular to the principal surface of the PWB.

In the lead terminal 3, length d of the lead 3 from the side wall of the insulating case 4 to the top end of the lead terminal 3=6.0 mm and width=0.5 mm. In order to strengthen the lead 3, the molded portion of the lead 3 which is molded into the insulating case 4 has been expanded in width so that width f=1.3 mm. As a material for the lead 3, a phosphor bronze plate (C-5210H) of thickness g=0.2 mm which was plated with nickel of 2 to 5 $\mu$m in thickness was used. The contact portion of the lead 3 to be brought into contact with the piezoelectric transformer element 1 had length in the longitudinal direction (contact length) L=0.5 mm.

A miniature spring probe was used as a contact pin 5 for keeping contact with the lower electrode of the piezoelectric transformer element. Its contact portion to be brought into contact with the piezoelectric transformer element 1 had a flat contact face in the shape of a circle of 0.9 mm in diameter whose contact area was 0.65 mm$^2$ or less. The contact pin 5 was provided with a slip-out preventing stopper 13 of 0.5 mm in thickness and 2.0 mm in outer diameter so that a spacing between the PWB and the piezoelectric transformer element 1 could be about 1.5 mm at the time of sealing the piezoelectric transformer element 1.

In the contact portions with the piezoelectric transformer element 1 by the lead 3 and the contact pin 5b, it was set that a press-in stroke from the upper and lower sides was 0.5 mm and a pressing force was 50 to 60 gf. As a result, the following advantages were obtained.

(i) By making one of contact portions to be brought into contact with the piezoelectric transformer element into a flat face contact, a contact of reliability being resistant to an external stress such as vibration or shock and resistant to vibration of the piezoelectric transformer element itself could be secured.

(ii) By supporting the piezoelectric transformer element with an area of 0.2% or less per contact in comparison with the projected area of the piezoelectric transformer element, a high power conversion efficiency could be attained without hampering vibration of the piezoelectric transformer element.

(iii) By supporting the piezoelectric transformer element with a pressing force of 60 gf or less by means of each lead and each press pin, a high power conversion efficiency could be attained without hampering vibration of the piezoelectric transformer element.

(iv) Since the support was performed by a pressing force of 50 gf or more, an electric contact of the piezoelectric transformer element was not opened being resistant to an external stress of 50 G or less and a good contact state could be kept against the external stress. To avoide the hampering of the vibration, the pressing force is selecte so as not to exceed 60 gf.

Figure 10:
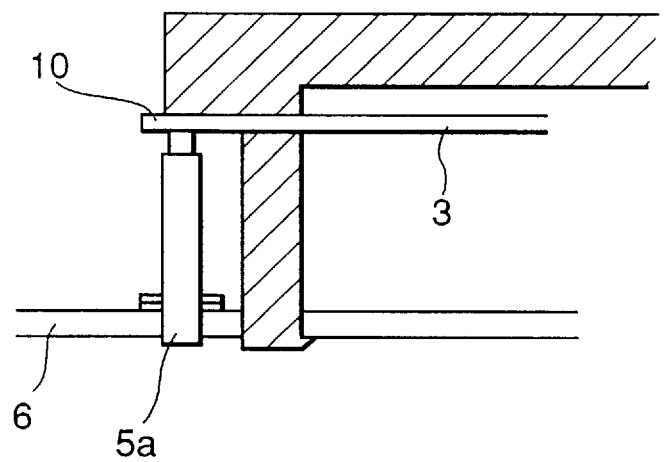
FIG. 10 is a sectional view showing a connecting structure of a contact pin provided between a lead and the PWB.

A miniature spring probe having the same spring constant as the contact pin 5b is used in a contact pin 5a which connects the lead terminal leading portion 10 of the lead 3 outside the insulating case 4 and the PWB 6 with each other. Since an upward-lifting force produced by an elastic member (not illustrated) such as a spring or the like built in the contact pin 5a always acted on the leading portion 10, the leading portion 10 could be increased in rigidity by providing a molded resin on the leading portion 10, as shown in FIG. 10.

In a pair of short-circuit preventing slits provided in the PWB 6, each of them was set to be 18 mm in length and 1 mm in width, wiring conductors connected respectively with the input and output terminals of the piezoelectric transformer element 1 were made 10 mm or more distant from each other in surface distance so as to improve insulation between the input and output conductors and to make small to the utmost a parasitic capacitance produced between the input and output conductors.

In a piezoelectric transformer of this embodiment, as described above, it was possible not only to prevent short-circuit between the input and output conductors but also to make small to the utmost a produced parasitic capacitance by using an insulating material for a case to accommodate the piezoelectric transformer element 1, by using a contact pin 5b for leading out the lower electrode 12 of the piezoelectric transformer element 1, by using a lead 3 narrow in width for leading out the upper electrode 11 of the piezoelectric transformer element 1, and by providing slits 15 between the input and output sides on the PWB 6.

As for electrical characteristics of the piezoelectric transformer of this embodiment, in consideration of capability of decreasing a parasitic capacitance and a wiring capacitance, when applying an alternating voltage of about 115 kHz to the input side of the piezoelectric transformer and performing a pseudo-lighting test with a pseudo-load (a parallel element of 100 kΩ in resistance and 15 pF in capacitance) supposing the output side as a cold cathode flourescent tube and then finding a power conversion efficiency through measuring the input and the output current, voltage, and power, it was confirmed that excellent electrical characteristics could be obtained which showed reduction in a power conversion efficiency being 0.5% or less in comparison with a state where the piezoelectric transformer element 1 was not cased.

Another effect of this embodiment is to prevent deterioration in characteristics of the piezoelectric transformer by performing no reflow process as described above. When the piezoelectric transformer element 1 is exposed to a high-temperature environment like a reflow process, its electromechanical coupling factor is lowered and as a result, deterioration in power conversion efficiency is caused, and it could be confirmed that a sample exposed to a reflow process was reduced by about 1% in power conversion efficiency in comparison with a sample exposed to no reflow process when examining their characteristics under the same conditions as said pseudo-lighting test.

However, according to this embodiment, since the piezoelectric transformer element 1 can be mounted only by combining together an insulating case 4 having snap fitting portions 7 and a printed wiring board 6 having slits 8 without performing a reflow process, deterioration in power conversion efficiency does not happen and it is possible to provide a piezoelectric transformer of high power conversion efficiency. And since it is a simple and easy mounting method, the present invention can provide a piezoelectric transformer being easier to assemble and lower in cost.

Second Embodiment

Next, a second embodiment of the invention is described with reference to the drawings.

Figure 11:
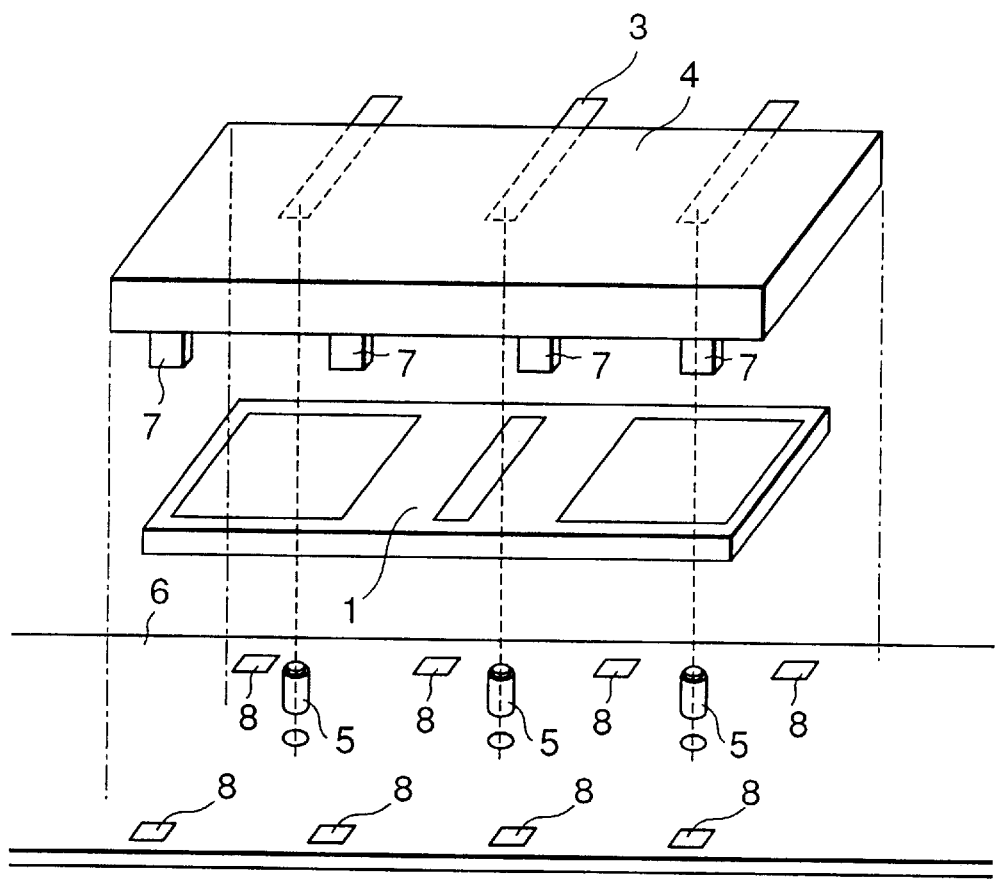
FIG. 11 is a perspective view showing construction of a second embodiment of the invention.

FIG. 11 is an exploded and perspective view showing this embodiment.

In this embodiment, a piezoelectric transformer element 1 and a contact pin 5b and its action are the same as the first embodiment. However, this embodiment is different from the first embodiment in that the upper electrode 11 of the piezoelectric transformer element 1 and a wiring (not illustrated) of the PWB 6 are connected with each other without using a contact pin 5a but by using a lead 3 insert-molded into an insulating case 4 of a concave shape.

Figure 12:
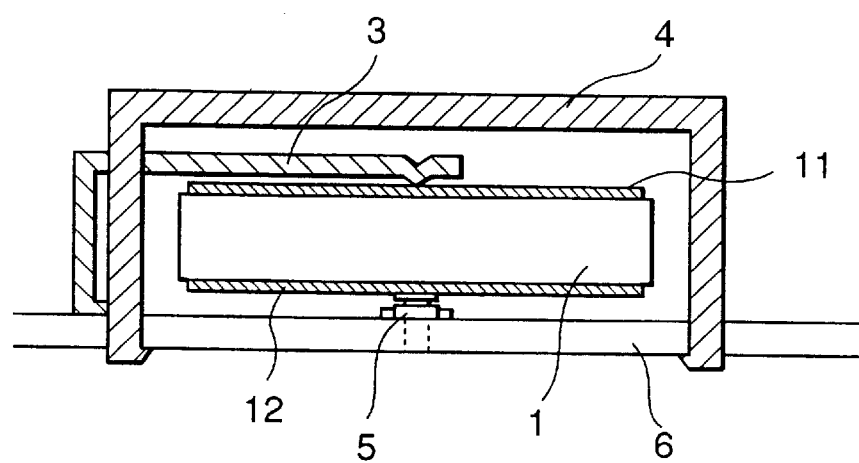
FIG. 12 is a sectional view taken in the width direction of FIG. 11 after combined together.

FIG. 12 shows a sectional view of a piezoelectric transformer of this embodiment mounted on the printed wiring board 6.

As shown in FIG. 12, this embodiment bends twice a lead 3 led out outside the insulating case 4, draws it around and to the contact face between the lower surface of the insulating case 4 and the PWB 6, and mounts on the PWB 6 the insulating case 4 containing the piezoelectric transformer element 1 by means of snap fitting portions 7 in the same way as said first embodiment.

Figure 13:
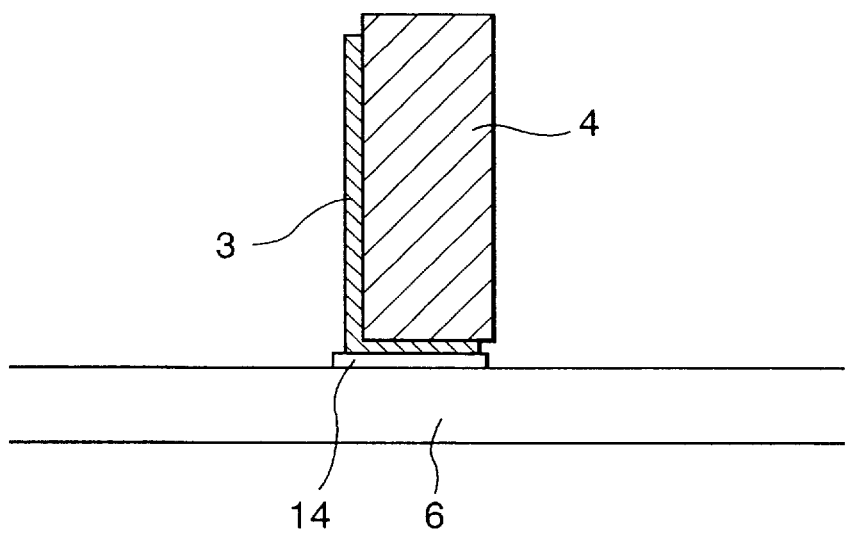
FIG. 13 is an enlarged sectional view showing a connection portion between the lead and the PWB shown in FIG. 12.

FIG. 13 shows a magnified sectional view of a connecting portion of the lead 3 and the PWB 6. Since the lead 3 is drawn around and to the PWB contact face by said bending process, a portion of the insulating case 4 to be used for drawing the lead 3 around is removed by a portion corresponding to thickness 0.2 mm of the lead 3 when the insulating case 4 is molded. Since the lead 3 is drawn around and to the contact face of the PWB, this embodiment can be easily implemented by providing an electrode land pattern 14 of the PWB 6 at the corresponding position.

In this embodiment, a pressing force for supporting the piezoelectric transformer element and a contact shape of it were the same as said first embodiment, vibration of the piezoelectric transformer element was not hampered, the piezoelectric transformer element 1 was not opened due to an external stress of 50 G or less, and a contact of reliability being resistant to vibration and shock could be secured. A parasitic capacitance and a wiring capacitance also were equivalent to the first embodiment, and with reduction in leakage current, under the same conditions as said pseudo-lighting test, excellent electrical characteristics could be attained which showed reduction in power conversion efficiency being 0.5% or less in comparison with a state where the piezoelectric transformer element 1 was not cased.

This embodiment, by using contact pins 5 of one kind, has an effect that the number of components can be reduced and the piezoelectric transformer can be lower in cost than the first embodiment.

Third Embodiment

A third embodiment is described in the following with reference to the drawings.

Figure 14:
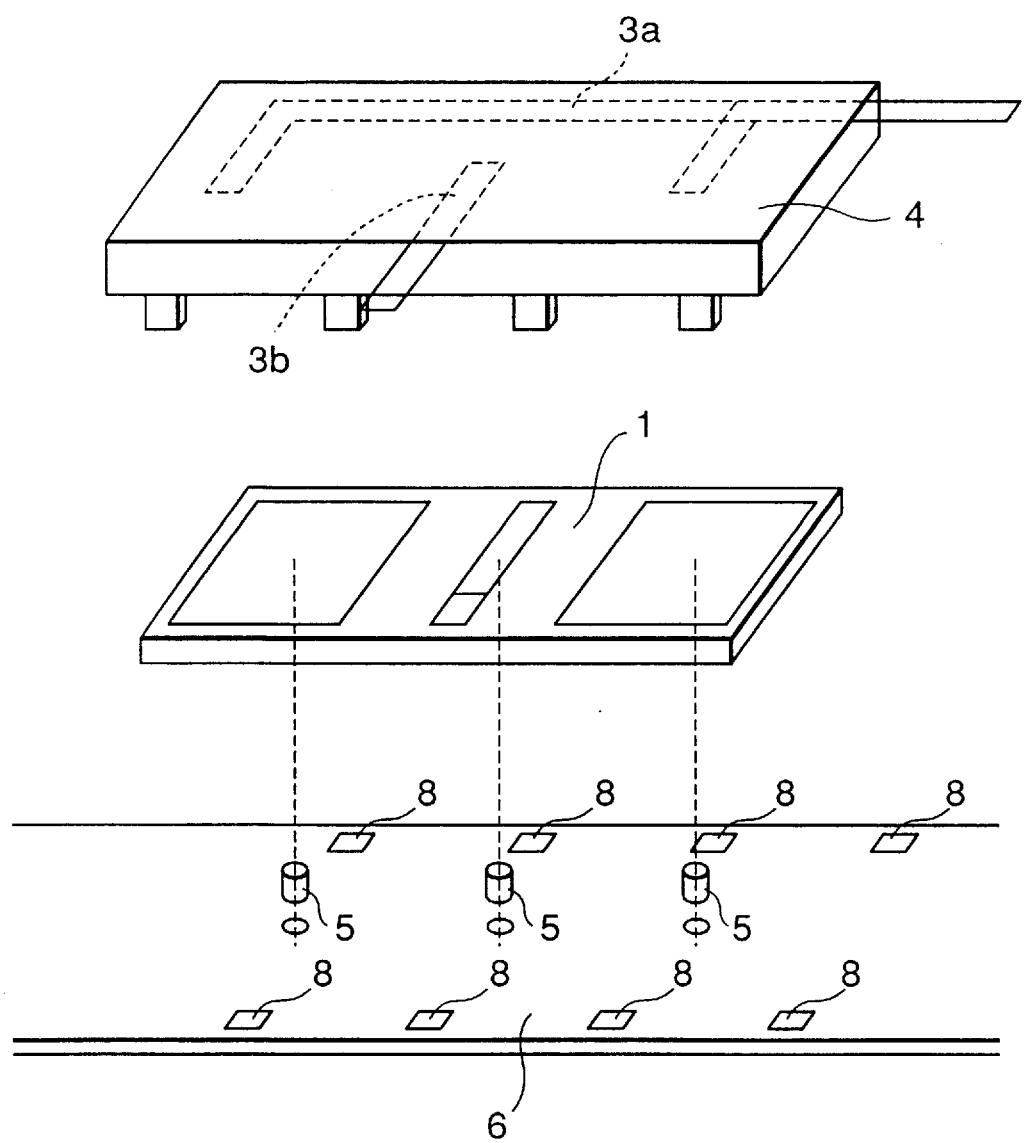
FIG. 14 is a perspective view showing construction of a third embodiment of the invention.

FIG. 14 is an exploded and perspective view showing this embodiment.

Figure 15:
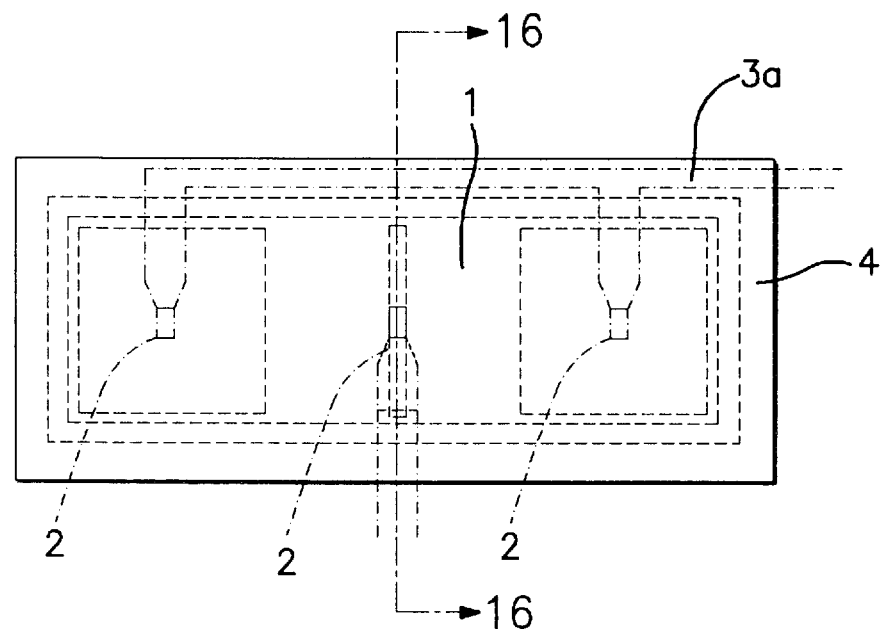
FIG. 15 is a plan view showing construction of the third embodiment of the invention.

FIG. 15 is a plan view showing a positional relation among the respective components of a piezoelectric transformer of this embodiment.

Figure 16:
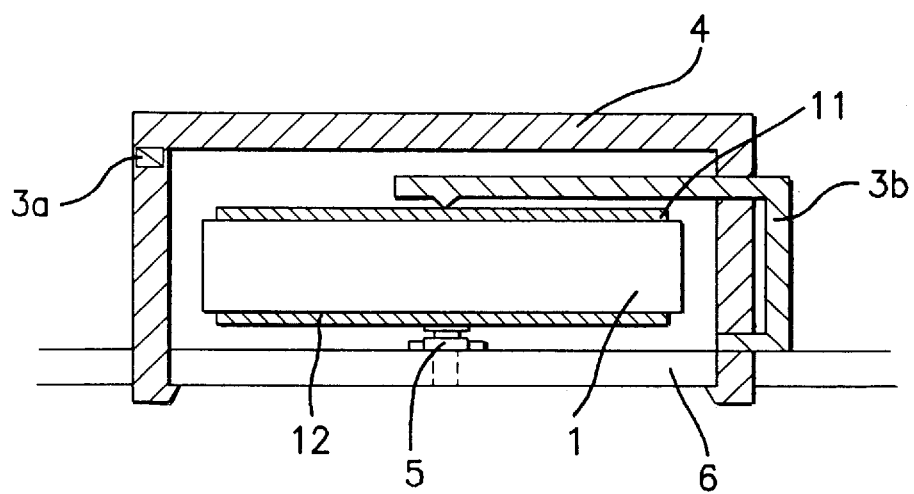
FIG. 16 is a sectional view taken along a line C—C of FIG. 15.

FIG. 16 is a sectional view showing a section taken along a line C—C of FIG. 15.

Figure 17A:
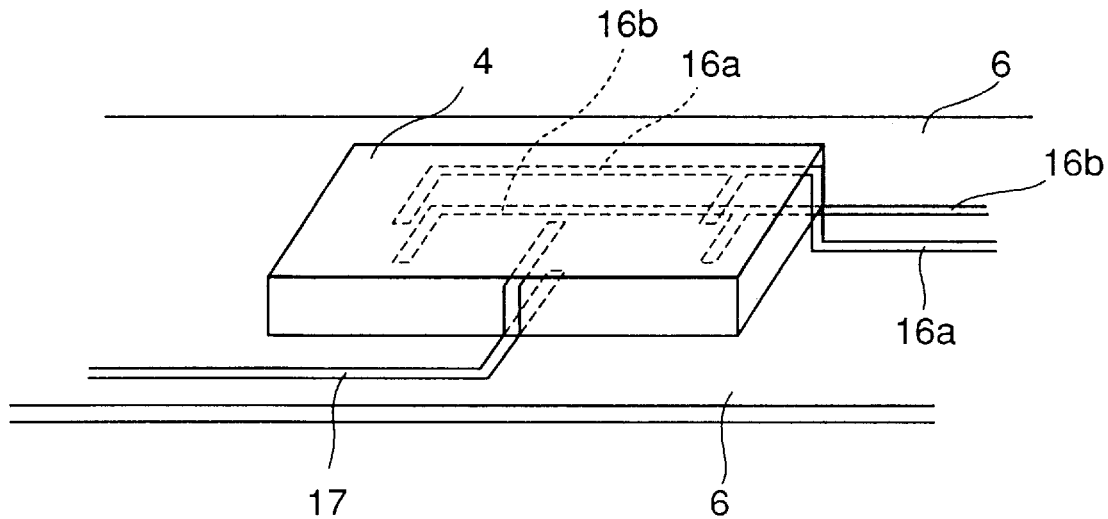
FIG. 17A is a perspective view schematically showing wiring patterns of the input and output sides of the piezoelectric transformer of the third embodiment of the invention.
Figure 17B:
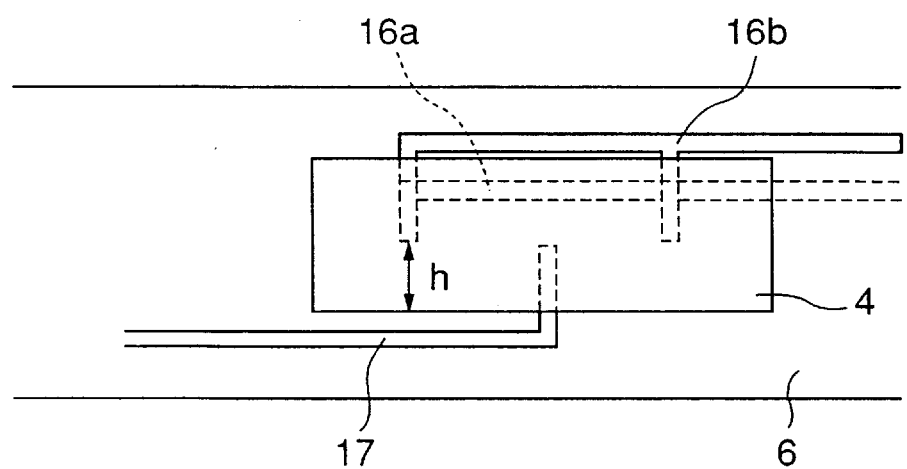
FIG. 17B is a plan view of FIG. 17A.
Figure 18A:
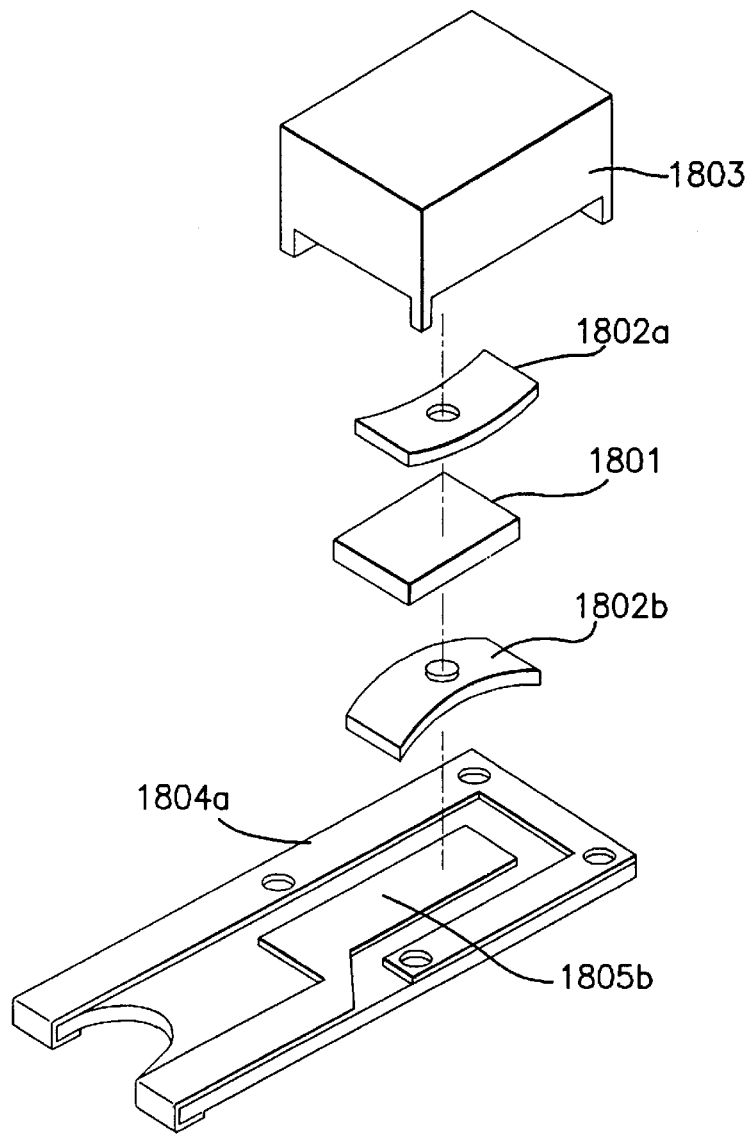
FIG. 18A is a perspective view showing a prior art structure.
Figure 18B:
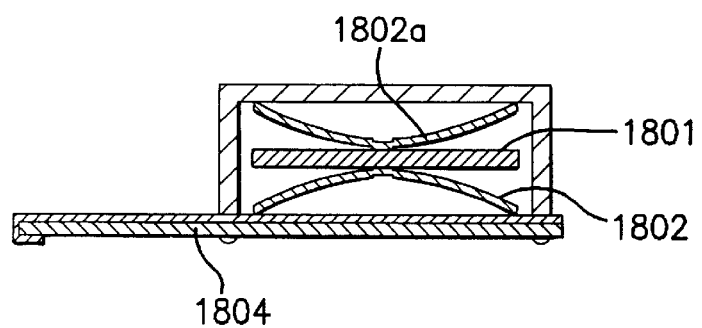
FIG. 18B is a sectional view of a combined structure of FIG. 18A.

FIG. 17 is a schematic view showing a state of leading out the input and output lines of the piezoelectric transformer and a wiring state of a PWB in this embodiment.

First, operation of the third embodiment is described.

In an alternating current circuit, a capacitive reactance Xc of a capacitor component is given by "Xc=1/(ωC)" (where ω: an angular frequency, C: capacitance). And since Ohm's law "V=Xc*I" holds, a relation of "I=ωCV" holds between a current I and a voltage V produced in the capacitor component. Therefore, the greater the potential difference applied to the capacitor component, the greater an electric current flowing in it, namely, leakage current.

In a piezoelectric transformer, by the way, since a high voltage of several hundreds to several thousands volts is produced between the input and output sides, a leakage current is liable to occur, being dependent on the layout of lead wires of the input and output sides. In the case where the input and the output wire are made close to each other on a PWB, the PWB material becomes a capacitor component and leakage current results.

In order to solve this problem, it is necessary to reduce the capacitive component produced due to wiring, by improving the layout of the input and the output wiring. Since a capacitance C of the capacitive component has a relation of "C=S/d" (S: area of the conductor and d: distance between the conductors), by increasing the distance between the input and the output wiring in a piezoelectric transformer, it is possible to reduce its capacitance C and increase its capacitive reactance, and thereby to reduce its leakage current.

Further, since in a piezoelectric transformer there is a great potential difference between the input and output sides, and an electric discharge is liable to happen, it is also useful from a viewpoint of improving its dielectric strength to make greater the distance between the input and output wirings.

Since it is in how to lead out the lea d terminal and in wiring of the PWB that the third embodiment is different from the first and second embodiments, these points are mainly described.

As for how to lay out electrodes at the input side, as shown in FIG. 14 and FIG. 15, the upper electrode was connected to an F-shaped wiring pattern using an F-shaped input lead terminal 3a and the lower electrode was connected to the F-shaped wiring pattern through a contact pin 5 in the same way as the second embodiment.

On the other hand, as for how to lay out electrodes at the output side, the output electrodes were laid out through an output lead 3b and a contact pin 5 respectively at the side having the input lead 3a and a wiring to be connected with it and at the side opposite to it.

In this embodiment, the shortest distance (h in FIG. 17) between the input wiring 16 and the output wiring 17 was about 8 mm which was about 2 times greater in comparison with the first and second embodiments. As the result, in this embodiment a parasitic capacitance was less than the first and second embodiments and the power conversion efficiency was improved by about 2%.

Furthermore, differently from the above-mentioned embodiments, a capacitance produced between the wirings could be reduced by providing slits between the input and the output side on the PWB or by making the upper input wiring 16a and the lower input wiring 16b respectively on the obverse and the reverse face of the PWB.

A first advantage of the invention is that it is possible to reduce a parasitic capacitance and a wiring capacitance produced around a piezoelectric transformer element and attain a piezoelectric transformer having a high power conversion efficiency.

A second advantage of the invention is that since a piezoelectric transformer element can be mounted on a PWB without performing a reflow process by adopting a one-touch mounting method using snap fittings, a piezoelectric transformer element is not deteriorated in characteristics and it is possible to attain a piezoelectric transformer high in power conversion efficiency as well as to provide a piezoelectric transformer low in manufacturing cost.

A third advantage of the invention is that it is possible to perform electrical connections in a piezoelectric transformer element of high reliability being resistant to an external stress such as vibration or shock and to perform a case mounting of a piezoelectric transformer element strong in strength.

Needless to say, application of a piezoelectric transformer of the prevent invention is not limited to the inverter circuit, but can be applied to an adapter power source circuit used in a common consumer product and a high voltage generating circuit used in an electronic copying machine and the like.

What is claimed is:

1. A piezoelectric transformer comprising: a piezoelectric transformer element provided with a plurality of upper electrodes and a plurality of lower electrodes on upper and lower faces of a piezoelectric member having a rectangular parallelepiped shape; an insulating case provided with a plurality of leads to be brought into contact with said plurality of upper electrodes, respectively, by means of a spring force of each of said leads; and a printed wiring board provided with a plurality of contact pins to be brought into contact with said plurality of lower electrodes of said piezoelectric transformer element; and a means for integrating said insulating case and said printed wiring board into one body.

2. A piezoelectric transformer as defined in claim 1, wherein wirings respectively connected to the upper and lower electrodes of said piezoelectric transformer element in a wiring pattern of said printed wiring board are 10 mm or more distant from each other in surface distance.

3. A piezoelectric transformer as defined in claim 1, wherein said insulating case is an insulating case of a concave shape having snap fitting portions.

4. A piezoelectric transformer as defined in claim 1, wherein one of said plurality of leads provided in said insulating case has a shape of a cantilever and at least one portion thereof is insert-molded into a side wall of said insulating case and its contact portion has a linear contact area.

5. A piezoelectric transformer as defined in claim 1, wherein one of said plurality of contact pins has a shape of a cylinder and its contact portion has a flat face contact area.

6. A piezoelectric transformer as defined in claim 1, wherein said piezoelectric transformer element is supported at its nodal points in order to support said piezoelectric transformer through said insulating case and said leads and said contact pins, and the supporting force per supporting point is 60 gf or less.

7. A piezoelectric transformer as defined in claim 4, wherein a size of said linear contact area is 0.5 mm or less in length.

8. A piezoelectric transformer as defined in claim 5, wherein a size of said contact pin contact area is 0.9 mm or less in diameter.

9. A piezoelectric transformer comprising:
   a piezoelectric transformer element of a third order Rosen type having three nodal points at three electrode positions on upper and lower faces thereof, respectively;
   an insulating case provided with three narrow leads to be brought into contact with the upper electrodes provided on said three positions of said piezoelectric transformer element by means of a spring force of said leads; and
   a printed wiring board provided with three contact pins to be brought into contact with the lower electrodes of said piezoelectric transformer element.

10. The piezoelectric transformer of claim 9, wherein said three narrow leads are spaced apart from an inner surface of said insulating case.

11. The piezoelectric transformer of claim 9, wherein said three narrow leads are insert-molded into said insulating case, said three narrow leads being expanded in width where molded into said insulating case.

12. The piezoelectric transformer of claim 9, wherein each of said contact pins is a miniature spring probe.

13. The piezoelectric transformer of claim 9, wherein said printed wiring board further comprises an output wiring bounded by two short-circuit-preventing slits.

14. The piezoelectric transformer of claim 9, wherein said printed circuit board further comprises a short-circuit-preventing slit adjacent one of said three contact pins.

* * * * *